US012306073B2

(12) United States Patent
Feng et al.

(10) Patent No.: US 12,306,073 B2
(45) Date of Patent: May 20, 2025

(54) ULTRA-LARGE PHYSICAL SIMULATION FACILITY FOR DEEP ENGINEERING DISASTERS

(71) Applicant: Northeastern University, Shenyang (CN)

(72) Inventors: Xiating Feng, Shenyang (CN); Xiwei Zhang, Shenyang (CN); Lei Shi, Shenyang (CN)

(73) Assignee: NORTHEASTERN UNIVERSITY, Shenyang (CN)

( * ) Notice: Subject to any disclaimer, the term of this patent is extended or adjusted under 35 U.S.C. 154(b) by 0 days.

(21) Appl. No.: 18/028,352

(22) PCT Filed: Feb. 8, 2023

(86) PCT No.: PCT/CN2023/074885
§ 371 (c)(1),
(2) Date: Mar. 24, 2023

(87) PCT Pub. No.: WO2024/152388
PCT Pub. Date: Jul. 25, 2024

(65) Prior Publication Data
US 2024/0319047 A1   Sep. 26, 2024

(30) Foreign Application Priority Data

Jan. 19, 2023   (CN) .......................... 202310058018.6

(51) Int. Cl.
*E21F 17/00*   (2006.01)
*G01M 99/00*   (2011.01)

(52) U.S. Cl.
CPC ........... *G01M 99/005* (2013.01); *E21F 17/00* (2013.01)

(58) Field of Classification Search
CPC .............................. E21F 17/00; G01M 99/005
See application file for complete search history.

(56) References Cited

U.S. PATENT DOCUMENTS

2017/0205531 A1   7/2017  Berard et al.
2021/0026027 A1*  1/2021  Zhang ..................... G01V 1/36
(Continued)

FOREIGN PATENT DOCUMENTS

CN   103398861 A   11/2013
CN   106018105 A   10/2016
(Continued)

OTHER PUBLICATIONS

Zhang Meizhu et al. "Triaxial compression test and reinforcement mechanism analysis of anchor-grouting reinforced samples of fractured marbles", vol. 39, No. 10, Oct. 31, 2018, pp. 3651-3660.

*Primary Examiner* — Eric S. McCall
(74) *Attorney, Agent, or Firm* — MUNCY, GEISSLER, OLDS & LOWE, P.C.

(57) ABSTRACT

Provided is an ultra-large physical simulation facility for deep engineering disasters, including a long-time large-load loading system for a geological model, a 3D printing system of a deep oil, gas and water multiphase multi-component complex geological body model, a high-temperature-chemical-multiphase fluid collaborative injection, monitoring and control system, a robot excavation and monitoring system for a complex engineering structure in a model under deep geological environment, an intelligent ventilation system for a deep metal mine complex drilling, mining and transferring network, an intelligent filling system for a deep metal mine ultra-large stope, a deep-well enhanced geothermal safe intelligent mining system, an all-spatial-temporal intelligent high-precision monitoring system for an excavation and fracture process of a large-scale geological model, and an ultra-large multi-task intelligent collaborative main control and digital twin system for physical simulation tests.

7 Claims, 4 Drawing Sheets

(56) References Cited

U.S. PATENT DOCUMENTS

| | | | |
|---|---|---|---|
| 2021/0389219 A1 | 12/2021 | Cheng et al. | |
| 2022/0288812 A1* | 9/2022 | Feng | B28B 1/001 |
| 2022/0308258 A1* | 9/2022 | Massonnat | G01V 20/00 |
| 2023/0332490 A1* | 10/2023 | Crumpton | G01V 20/00 |
| 2024/0230495 A1* | 7/2024 | Feng | G01N 3/08 |
| 2024/0393496 A1* | 11/2024 | Guo | G01V 3/02 |
| 2025/0086333 A1* | 3/2025 | Zhang | G01M 99/007 |

FOREIGN PATENT DOCUMENTS

| | | |
|---|---|---|
| CN | 108124460 A | 6/2018 |
| CN | 108375665 A | 8/2018 |
| CN | 108638289 A | 10/2018 |
| CN | 113917110 A | 1/2022 |
| CN | 114965006 A | 8/2022 |
| CN | 115112479 A | 9/2022 |
| CN | 115372152 A | 11/2022 |

* cited by examiner

ULTRA-LARGE PHYSICAL SIMULATION FACILITY FOR DEEP ENGINEERING DISASTERS

BACKGROUND OF THE INVENTION

1. Field of the Invention

The invention relates to the technical field of rock mechanics tests, and particularly relates to an ultra-large physical simulation facility for deep engineering disasters, which is used for indoor simulation of the whole inoculation process of multiple types of deep engineering disasters induced by deep rock engineering excavation, mining, and the like.

2. The Prior Arts

Deep-ground engineering represented by deep resource mining, deep buried traffic tunnel (hole) excavation, deep energy development, and the like. is developing from the kilometer burial depth to the ten-thousand-meter burial depth. Its occurrence environment is characterized by ultra-high tectonic stress, ultra-high fluid pressure, ultra-high temperature, and other extreme features. The geological structure shows the complexities of large-scale folds, faults, hard structural planes, layered structures, trap structures, and the like. Under the coupling effect of the above extreme occurrence environment and complex geological structures, mining, excavation, extraction, and other activities of deep hard rocks are very easy for induction of rockbursts, rib spalling, large deformation, earthquake, $CO_2$ leakage and other disasters, thereby resulting in a large number of casualties and economic losses.

Based on a similarity theory, three-dimensional physical model tests on similar materials prepare a physical model sample similar to engineering rock masses, boundary stress is applied to the physical model sample through a three-dimensional loading system, stress, deformation, fracture and other multi-element information of the physical model sample are monitored during the excavation process, and simulation and monitoring of the incubation process of the deep engineering disasters are realized. This type of test can truly restore the geological structure relatively, control the three-dimensional boundary stress, simulate engineering excavation behaviors, selectively control induction conditions, and physically reproduce the fracture and disaster causing process of important parts. The test is a basic means to deal with the mechanism analysis and early warning research of major geological disasters.

For example, Chinese patent application No. 201310336255.0 discloses a true-triaxial rockburst physical simulation test system for deep tunnels, which is mainly used to study the induction mechanism of rockbursts by blasting vibration; Chinese patent application No. 201610326802.0 discloses a multifunctional physical simulation test system for coal and rock engineering and a coal and rock model test method, which are mainly used to simulate coal and gas outburst problems under the action of ground stress and gas stress; Chinese patent application No. 201780002869.1 discloses an intelligent CNC ultra-high pressure true three-dimensional non-uniform loading and unloading and pressure stabilization model test system, and the system has a loading capacity of 4500 t and is mainly used to simulate the discontinuous deformation and failure process of deep cavern excavation; and Chinese patent application No. 202111164829.1 discloses a multifunctional three-dimensional similar simulation test platform and test method, which mainly simulate microwave thermal rock breaking and crack enhancement.

However, the existing three-dimensional physical model test on similar materials still has the following problems: 1) the simulated geological conditions, occurrence environment and engineering activities are single, and the deep-ground engineering activities such as oil, gas and water multiphase multi-component complex cavern group excavation, horizontal well fracturing, deep geothermal exploitation, deep metal mine stope group mining, ventilation, filling, and the like cannot be simulated; 2) the model size is mainly in 1-2 m, and the physical model similarity ratio is too large, thereby resulting in distortion of geological structure information, the complexity of deep engineering cannot be effectively reproduced, and the ability of engineering behavior simulation and online monitoring is limited; 3) physical simulation of the engineering scope with the depth of 100-1000-meter scale cannot be realized; 4) the tectonic stress environment in deep engineering cannot be simulated, so that study on a geological hazard mechanism under the coupling of tectonic stress and engineering activities is limited; and 5) the loading capacity is less than 10000 t, so that high ground stress boundary conditions cannot be applied to an ultra-large similar material model.

Therefore, it is very necessary to develop an ultra-large physical simulation facility for deep engineering disasters when facing the deep-ground engineering with a burial depth of 10000 meters. Compared with a three-dimensional physical model test loading device on similar materials of existing size levels, the problems that need to be solved include: mechanical design analysis and limit processing technology guarantee of an ultra-large geological model loading frame under extreme conditions, uncoordinated deformation of the structure caused by local stress concentration of the frame structure under the ultra-high load conditions, and low loading synchronicity and stability control accuracy of same axial stress for ultra-large sections. In view of the complexity of deep ground stress environment, geological structure, engineering activities, and the like, the ultra-large physical simulation facility for deep engineering disasters also needs to solve the following problems: 1) the coupled simulation problem of extreme occurrence environment such as deep ultra-high tectonic stress, ultra-high fluid pressure and ultra-high temperature; 2) the simulation problem of deep-ground complex geological structures of large-scale folds, faults, hard structural planes, layered structures, trap structures, and the like; 3) the problems of simulation and transparent monitoring of the incubation process of multiple types of disasters induced by deep and complex engineering activities; 4) the simulation problems of complex stress environments such as deep-ground high ground stress, tectonic stress, asymmetric stress and excavation disturbance stress; and 5) the problems of high stress loading, uniformly-distributed stress loading and long-term stable loading of the ultra-large physical model sample.

SUMMARY OF THE INVENTION

In view of the problems in the existing technology, the invention provides an ultra-large physical simulation facility for deep engineering disasters. For an ultra-large physical model sample, refined 3D printing of a multiphase multi-component complex geological structure can be realized, and besides, the loading requirements of a multiphase multi-component 3D printing geological body model under deep complex geological conditions for true-triaxial high stress, tectonic stress and disturbance stress can be met, multi-element information of the whole inoculation process of deformation, ultrasound, acoustic emission and geological disasters under complex engineering activities such as excavation, mining, extraction and ventilation can be intelligently and transparently monitored; and multi-task intelligent collaborative main control and big data cloud sharing can be realized, and simulation of 100-10000 m deep rock stress environment in the range of 1:40-1:100 stress similarity ratio and 50000-12550000 $m^3$ engineering scope similarity ratio can be met.

In order to realize the above purpose, the invention adopts the technical scheme that an ultra-large physical simulation facility for deep engineering disasters comprises a long-time large-load loading system for a geological model, a 3D printing system of a deep oil, gas and water multiphase multi-component complex geological body model, a high-temperature-chemical-multiphase fluid collaborative injection, monitoring and control system, a robot excavation and monitoring system for a complex engineering structure in a model under deep geological environment, an intelligent ventilation system for a deep metal mine complex drilling, mining and transferring network, an intelligent filling system for a deep metal mine ultra-large stope, a deep-well enhanced geothermal safe intelligent mining system, an all-spatial-temporal intelligent high-precision monitoring system for an excavation and fracture process of a large-scale geological model, and an ultra-large multi-task intelligent collaborative main control and digital twin system for physical simulation tests, wherein the long-time large-load loading system for the geological model comprises a large concrete foundation pit mounting slot, an ultra-large physical simulation test device for deep engineering disasters, a distributed main control center, a cluster large-flow high-pressure hydraulic pump station, a circulating cooling water cooling tower and an electric control cabinet; the ultra-large physical simulation test device for deep engineering disasters is arranged in the large concrete foundation pit mounting slot; the distributed main control center, the circulating cooling water cooling tower and the electric control cabinet are located on the ground and adjacent to the large concrete foundation pit mounting slot; the cluster large-flow high-pressure hydraulic pump station is located under the ground, and is adjacent to the large concrete foundation pit mounting slot; the 3D printing system of the deep oil, gas and water multiphase multi-component complex geological body model is located on the ground and adjacent to the ultra-large physical simulation test device for deep engineering disasters, and a model sample transferring device is configured between the 3D printing system of the deep oil, gas and water multiphase multi-component complex geological body model and the ultra-large physical simulation test device for deep engineering disasters; the high-temperature-chemical-multiphase fluid collaborative injection, monitoring and control system is used in conjunction with the ultra-large physical simulation test device for deep engineering disasters, and comprises a gas injection pressurization and monitoring device and a water injection pressurization and monitoring device which are used for injection and real-time monitoring of liquid phase, gas phase, critical and supercritical gas, a chemical reaction pressurization and monitoring device for realizing injection of acid chemical solution fluid, a constant pressure and constant flow device and a constant temperature and constant pressure device; the robot excavation and monitoring system for the complex engineering structure in a model under deep geological environment is used in conjunction with the ultra-large physical simulation test device for deep engineering disasters, and comprises a three-coordinate feeding system for excavation of primary channels, and a multi-joint peristaltic robot for fine excavation of secondary channels and fine excavation of tertiary and remote structures, wherein the multi-joint peristaltic robot is provided with a rotary reamer, an auxiliary tooling and a multi-degree-of-freedom flexible manipulator; the intelligent ventilation system for the deep metal mine complex drilling, mining and transferring network is used in conjunction with the ultra-large physical simulation test device for deep engineering disasters, and is used for simulating ventilation engineering activities; the intelligent filling system for the deep metal mine ultra-large stope is used in conjunction with the ultra-large physical simulation test device for deep engineering disasters and is used for simulating filling of the stope; the deep-well enhanced geothermal safe intelligent mining system is used in conjunction with the ultra-large physical simulation test device for deep engineering disasters and is used for simulating drilling of injection wells and production wells; the all-spatial-temporal intelligent high-precision monitoring system for the excavation and fracture process of the large-scale geological model comprises many types of sensors, the sensors are mounted in a pre-embedded manner in a 3D printing process of a physical model sample, and the all-spatial-temporal intelligent high-precision monitoring system for the excavation and fracture process of the large-scale geological model is used for monitoring many types of sensing data; the ultra-large multi-task intelligent collaborative main control and digital twin system for the physical simulation tests is located on the ground and adjacent to the ultra-large physical simulation test device for deep engineering disasters, and comprises a collaborative main control subsystem for data interconnection, collaborative control and scheduling, as well as data acquisition and display among various systems in the facility, and a big data computing subsystem for batch flow fusion tests used for batch flow fusion processing of a unified computing engine, and a digital twin subsystem for physical simulation tests used for fully transparent interactive display of deep engineering physical simulation tests.

The ultra-large physical simulation test device for deep engineering disasters comprises a horizontal ultra-large reaction frame, a vertical ultra-large reaction frame, a first array distributed hydraulic actuator group, a second array distributed hydraulic actuator group, a third array distributed hydraulic actuator group, a fourth array distributed hydraulic actuator group, a fifth array distributed hydraulic actuator group, a linear distributed hydraulic actuator group and ultra-long stroke lifting and locking hydraulic cylinders, wherein the vertical ultra-large reaction frame comprises a reaction top plate, support columns and a reaction base, wherein the horizontal ultra-large reaction frame adopts a circular structure being circular in an outer part and square in an inner part; the horizontal ultra-large reaction frame is fixedly mounted in the large concrete foundation pit mounting slot, and an excavation channel is provided in a side of the horizontal ultra-large reaction frame; the horizontal ultra-large reaction frame is formed by splicing eight segments of arch beams through carbon fiber winding; the vertical ultra-large reaction frame is located inside the horizontal ultra-large reaction frame; the reaction base is located directly below the reaction top plate, the reaction base and the reaction top plate are fixedly connected by the four uniformly-distributed support columns, and the vertical ultra-large reaction frame forms a double-beam four-column preload frame structure; a drilling channel is formed in the reaction top plate; the four ultra-long stroke lifting and locking hydraulic cylinders are uniformly arranged between the horizontal ultra-large reaction frame and the reaction top plate; a cylinder barrel of each ultra-long stroke lifting and locking hydraulic cylinder is embedded and fixed in the horizontal ultra-large reaction frame, and a piston rod of each ultra-long stroke lifting and locking hydraulic cylinder is upwards to be fixedly connected with the reaction top plate; the first array distributed hydraulic actuator group is arranged on a lower surface of the reaction top plate; the second array distributed hydraulic actuator group, the third array distributed hydraulic actuator group, the fourth array distributed hydraulic actuator group and the fifth array distributed hydraulic actuator group are respectively arranged on an inner square surface of the horizontal ultra-large reaction frame, the second array distributed hydraulic actuator group and the fourth array distributed hydraulic actuator group are distributed in opposite directions, and the third array distributed hydraulic actuator group and the fifth array distributed hydraulic actuator group are distributed in opposite directions; and the linear distributed hydraulic actuator group is embedded at a middle of an upper surface of the reaction base, and a loading surface of the linear distributed hydraulic actuator group is flush with the upper surface of the reaction base.

All single hydraulic actuators contained in the linear distributed hydraulic actuator group are dynamic hydraulic actuators, and a maximum disturbance frequency of the dynamic hydraulic actuators is 5 Hz; an external bracket of each dynamic hydraulic actuator comprises four guide rods resisting lateral force; and each dynamic hydraulic actuator adopts a double-output rod symmetrical structure, a large-flow integrated valve block is arranged outside a cylinder barrel of each dynamic hydraulic actuator, and each large-flow integrated valve block is provided with double servo valves.

The structures of the single hydraulic actuators contained in the first array distributed hydraulic actuator group, the second array distributed hydraulic actuator group, the third array distributed hydraulic actuator group, the fourth array distributed hydraulic actuator group and the fifth array distributed hydraulic actuator group are the same, a magnetostrictive displacement sensor is arranged between a piston inside a cylinder barrel and a bottom plate of the cylinder barrel of each single hydraulic actuator, a servo valve and an energy accumulator are arranged outside the cylinder barrel of each single hydraulic actuator, and a load sensor is arranged at a piston end of each single hydraulic actuator.

The single hydraulic actuators at centers of the first array distributed hydraulic actuator group, the second array distributed hydraulic actuator group, the third array distributed hydraulic actuator group, the fourth array distributed hydraulic actuator group and the fifth array distributed hydraulic actuator group all adopt through-type hydraulic actuators, and a piston rod of each through-type hydraulic actuator adopts a double-output rod hollow structure.

A hydraulic oil source system is arranged in the cluster large-flow high-pressure hydraulic pump station, adopts a distributed hydraulic station design scheme, and comprises eight hydraulic stations in total; and the first five hydraulic stations are respectively connected with the first array distributed hydraulic actuator group, the second array distributed hydraulic actuator group, the third array distributed hydraulic actuator group, the fourth array distributed hydraulic actuator group and the fifth array distributed hydraulic actuator group, the sixth hydraulic station is connected with the linear distributed hydraulic actuator group, the seventh hydraulic station is connected with the ultra-long stroke lifting and locking hydraulic cylinders, and the eighth hydraulic station serves as a standby hydraulic station.

The long-time large-load loading system for the geological model adopts a distributed network control system with a single actuator controller as a node for redundancy control of the system and hot replacement of the controller; the distributed network control system comprises three layers of structures, wherein a main controller is in a first layer, loading surface array controllers are in a second layer, and a controller of each independent loading actuator is in a third layer; the main controller is used for human-computer interaction, test management, test mode setting, and local storage and upload of test data; the main controller performs data exchange with the ultra-large multi-task intelligent collaborative main control and digital twin system for the physical simulation tests through a Modbus TCP/UDP protocol; the main controller performs data exchange with the loading surface array controller distributed on each loading surface through a network cable according to the Modbus TCP/UDP protocol; and the loading surface array controllers perform data exchange with the controller of each independent loading actuator through a network cable according to the Modbus TCP/UDP protocol.

The facility has the beneficial effects:

1. The invention can simulate deep complex geological structures and extreme occurrence environment.

Through a 3D printing technology of a deep multiphase multi-component complex geological body model, intelligent printing of geological structures such as folds, faults, hard structural planes, layered structures and trap structures can be realized in the ultra-large physical model sample. Through local printing of geotechnical sealing materials, supplemented with a high-temperature-chemical-multiphase fluid collaborative injection, monitoring and control technology, and a deep-well enhanced geothermal safe intelligent mining technology, injection of fluid pressure, high-temperature environment, chemical materials, and the like can be realized, and the deep complex geological structure and extreme occurrence environment can be simulated.

2. The invention can simulate complex engineering activities.

Through a micro-robot excavation and drilling technology of complex tunnel cavern groups, a deep oil and gas development and reservoir simulation technology, an intelligent ventilation technology for a deep metal mine complex drilling and transferring network, an intelligent filling technology for a deep metal mine ultra-large stope, a deep-well enhanced geothermal safe intelligent mining technology, and supplemented with an interface reserved by a geological model long-time large-load loading system, simulation of mining, excavation, ventilation, filling, extraction and other complex engineering activities can be realized.

3. The invention can realize the true-triaxial boundary stress uniform loading and tectonic stress simulation of an ultra-large physical model sample.

Through a plane orthogonal high-stiffness loading structure, supplemented by a carbon fiber winding process, based on an array hydraulic actuator loading technology and a distributed network redundancy control technology with a single actuator controller as a node, independent loading, local loading and synchronous loading of hydraulic actuators can be realized, especially local high stress can be applied to a certain geological structure, and the deep tectonic stress environment simulation can be realized.

4. The invention can realize three-dimensional visualization of the whole inoculation process of geological hazards of the physical model sample.

The precise reconstruction of a complex geological structure and a geological model of extreme occurrence environment can be realized through an ultra-large physical simulation digital twin technology of deep engineering disasters. Based on a fully transparent real-time rendering technology, real-time display of complex engineering activities such as excavation, mining, extraction, ventilation and filling can be realized, and supplemented with an all-spatial-temporal intelligent high-precision monitoring technology of an excavation and fracture process of a large-scale geological model, real-time monitoring of crack location, direction and scale can be realized, and real-time rendering of the whole inoculation process of geological disasters can be realized.

In drawings, 1: long-time large-load loading system for geological model, 2: 3D printing system of deep oil, gas and water multiphase multi-component complex geological body model, 3: high-temperature-chemical-multiphase fluid collaborative injection, monitoring and control system, 4: robot excavation and monitoring system for complex engineering structure in model under deep geological environment, 5: intelligent ventilation system for deep metal mine complex drilling, mining and transferring network, 6: intelligent filling system for deep metal mine ultra-large stope, 7: deep-well enhanced geothermal safe intelligent mining system, 8: all-spatial-temporal intelligent high-precision monitoring system for excavation and fracture process of large-scale geological model, 9: ultra-large multi-task intelligent collaborative main control and digital twin system for physical simulation tests, 10: large concrete foundation pit mounting slot, 11: ultra-large physical simulation test device for deep engineering disasters, 12: distributed main control center, 13: cluster large-flow high-pressure hydraulic pump station, 14: circulating cooling water cooling tower, 15: electric control cabinet, 16: model sample transferring device, 17: horizontal ultra-large reaction frame, 18: first array distributed hydraulic actuator group, 19: second array distributed hydraulic actuator group, 20: third array distributed hydraulic actuator group, 21: fourth array distributed hydraulic actuator group, 22: fifth array distributed hydraulic actuator group, 23: linear distributed hydraulic actuator group, 24: ultra-long stroke lifting and locking hydraulic cylinder, 25: reaction top plate, 26: support column, 27: reaction base, 28: excavation channel, 29: drilling channel, 30: hydraulic station, and 31: through-type hydraulic actuator.

DETAILED DESCRIPTION OF THE PREFERRED EMBODIMENT

The invention will be further described in detail with reference to the attached drawings and specific embodiments.

Figure 1:
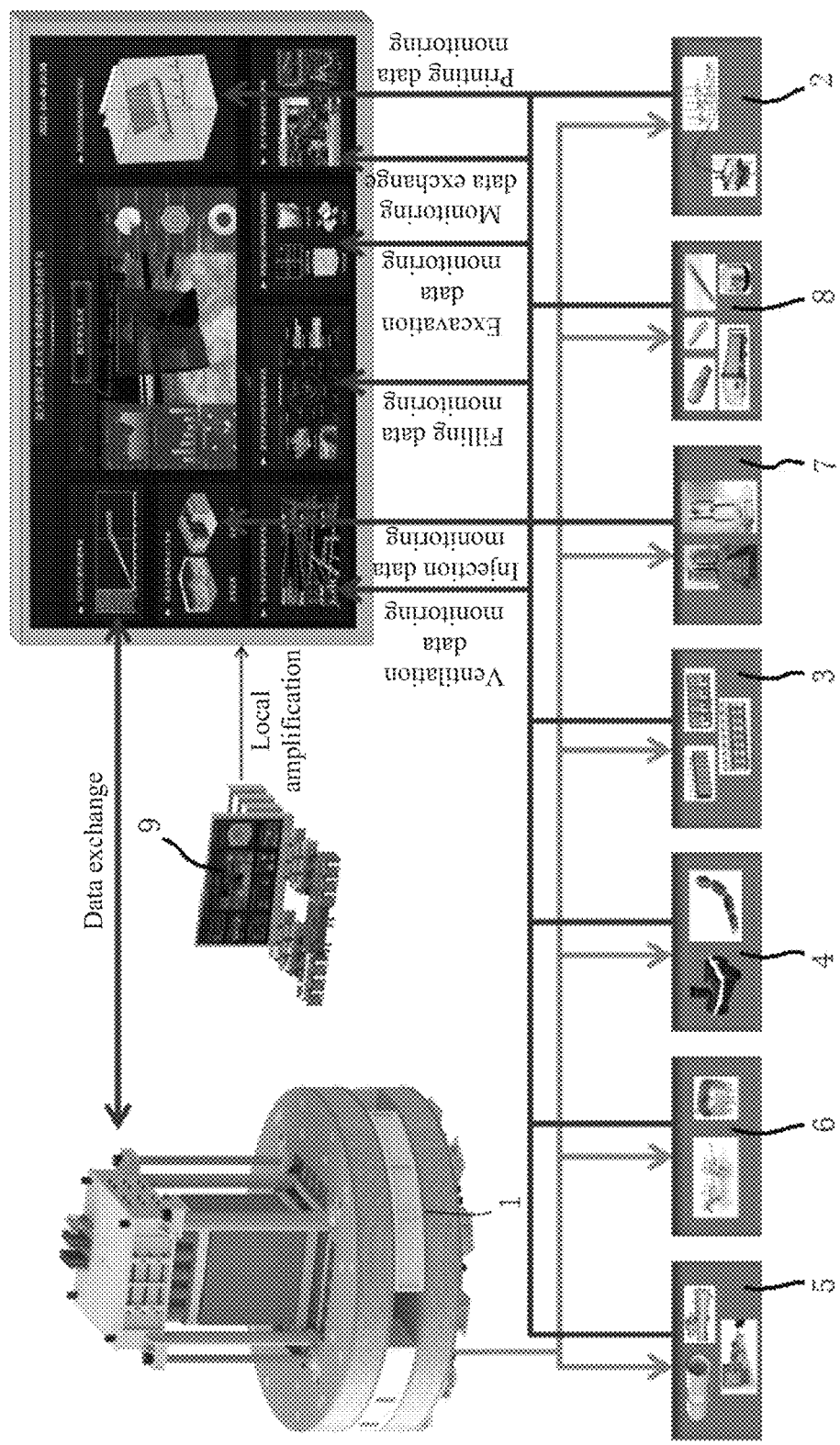
FIG. 1 is a structural principle block diagram of an ultra-large physical simulation facility for deep engineering disasters of the invention.
Figure 2:
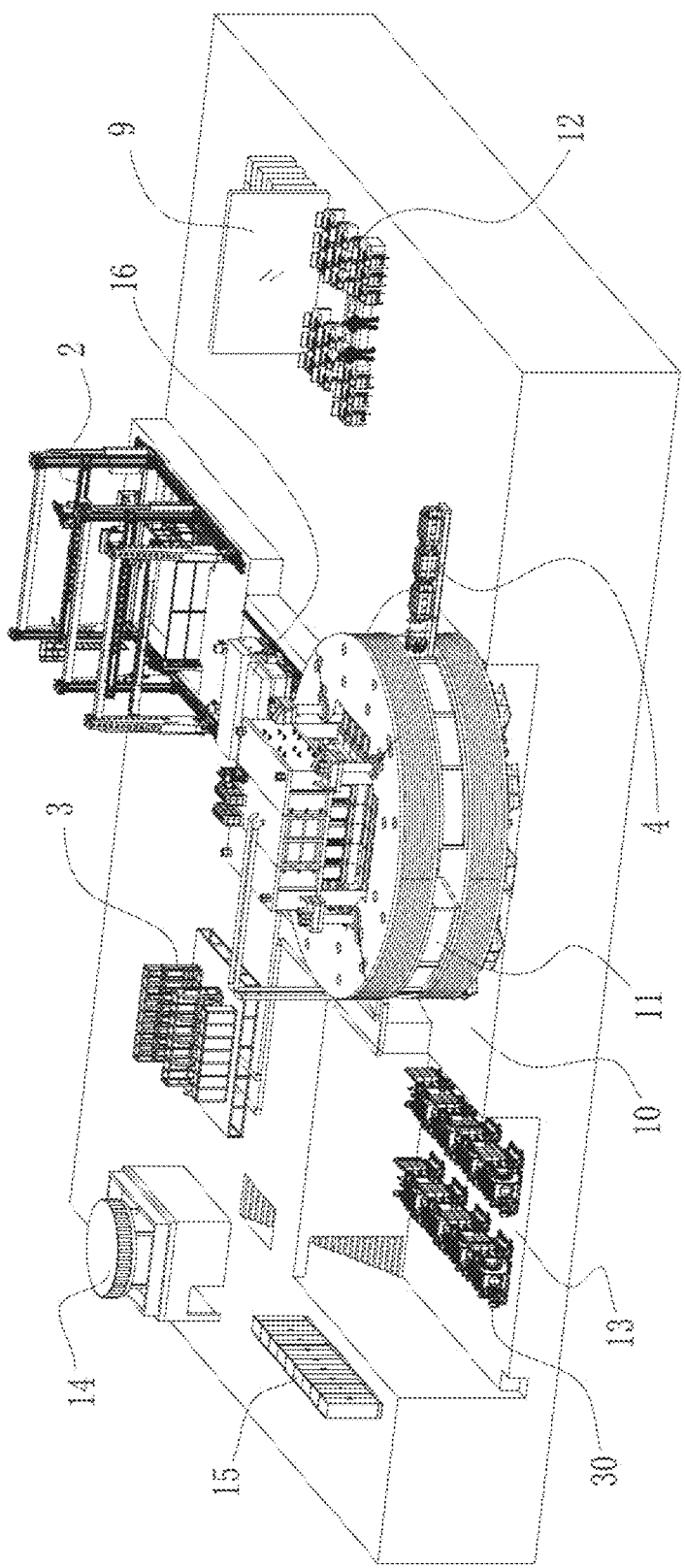
FIG. 2 is a structural schematic diagram of the ultra-large physical simulation facility for deep engineering disasters of the invention.
Figure 3:
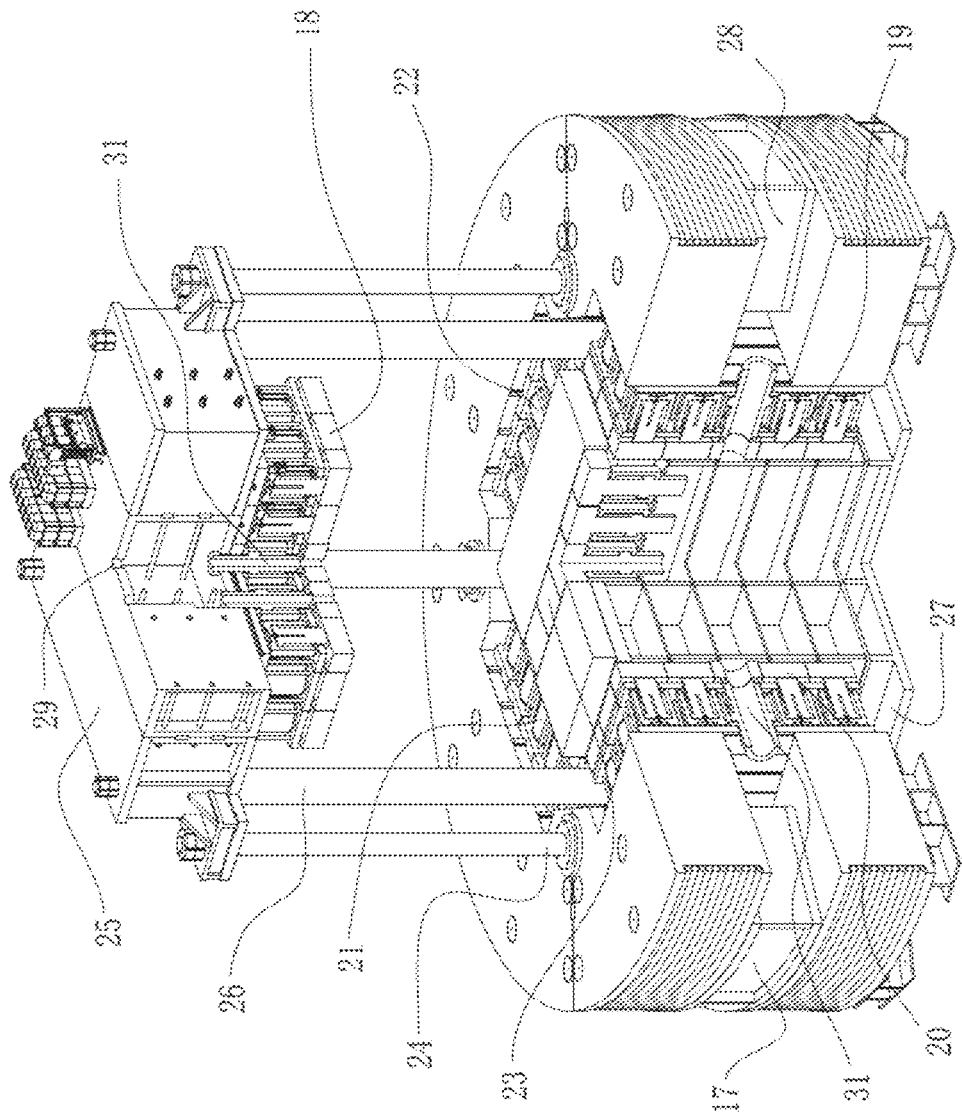
FIG. 3 is a structural diagram of the ultra-large physical simulation test device (state I) for the deep engineering disasters of the invention.
Figure 4:
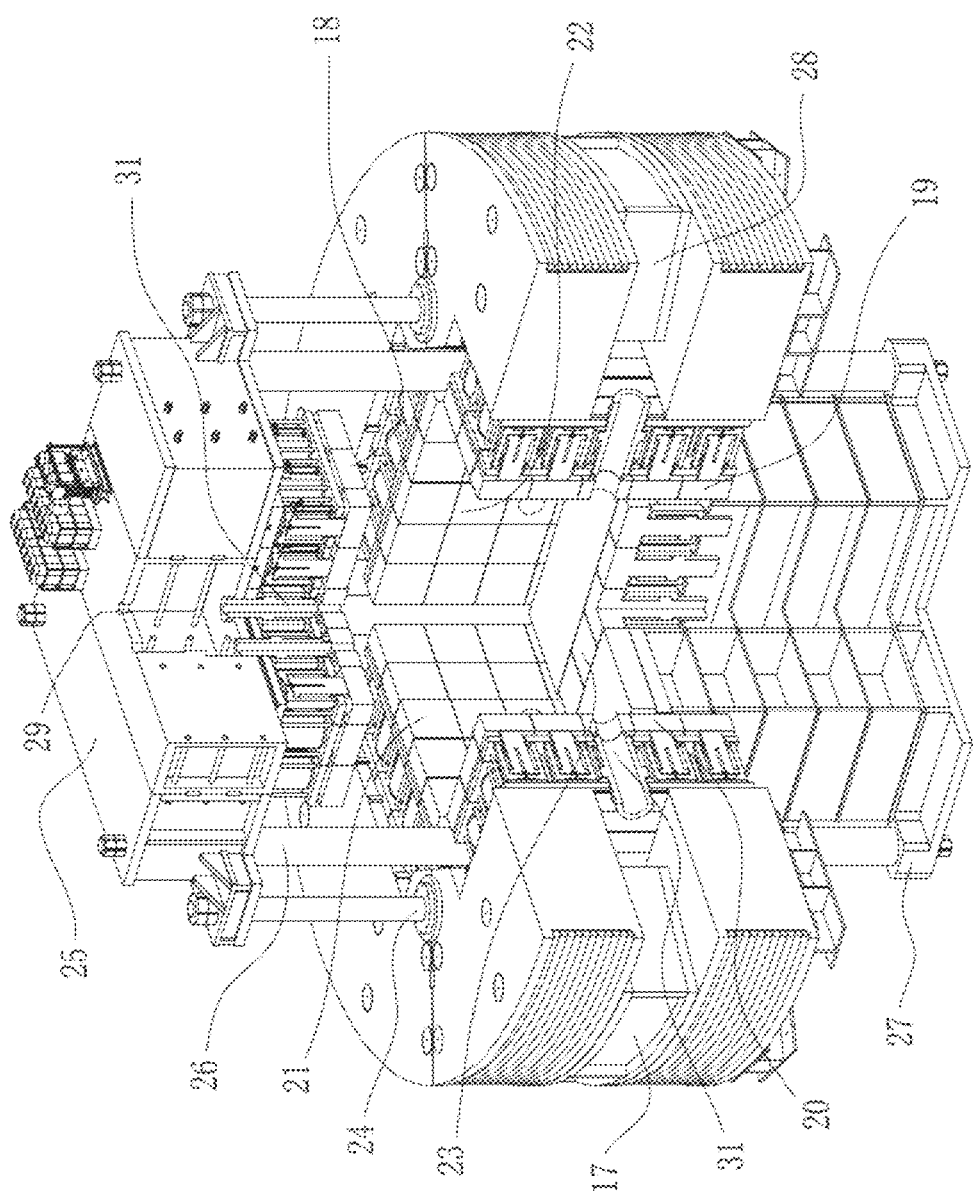
FIG. 4 is a structural diagram of the ultra-large physical simulation test device (state II) for the deep engineering disasters of the invention.

As shown in FIGS. 1-4, the ultra-large physical simulation facility for deep engineering disasters comprises a long-time large-load loading system 1 for a geological model, a 3D printing system 2 of a deep oil, gas and water multiphase multi-component complex geological body model, a high-temperature-chemical-multiphase fluid collaborative injection, monitoring and control system 3, a robot excavation and monitoring system 4 for a complex engineering structure in a model under deep geological environment, an intelligent ventilation system 5 for a deep metal mine complex drilling, mining and transferring network, an intelligent filling system 6 for a deep metal mine ultra-large stope, a deep-well enhanced geothermal safe intelligent mining system 7, an all-spatial-temporal intelligent high-precision monitoring system 8 for an excavation and fracture process of a large-scale geological model, and an ultra-large multi-task intelligent collaborative main control and digital twin system 9 for physical simulation tests, wherein the long-time large-load loading system 1 for a geological model comprises a large concrete foundation pit mounting slot 10, an ultra-large physical simulation test device 11 for deep engineering disasters, a distributed main control center 12, a cluster large-flow high-pressure hydraulic pump station 13, a circulating cooling water cooling tower 14 and an electric control cabinet 15; the ultra-large physical simulation test device 11 for deep engineering disasters is arranged in the large concrete foundation pit mounting slot 10; the distributed main control center 12, the circulating cooling water cooling tower 14 and the electric control cabinet 15 are located on the ground and adjacent to the large concrete foundation pit mounting slot 1; the cluster large-flow high-pressure hydraulic pump station 13 is located under the ground, and is adjacent to the large concrete foundation pit mounting slot 10; the 3D printing system 2 of a deep oil, gas and water multiphase multi-component complex geological body model is located on the ground and adjacent to the ultra-large physical simulation test device 11 for deep engineering disasters, and a model sample transferring device 16 is configured between the 3D printing system 2 of a deep oil, gas and water multiphase multi-component complex geological body model and the ultra-large physical simulation test device 11 for deep engineering disasters; the high-temperature-chemical-multiphase fluid collaborative injection, monitoring and control system 3 is used in conjunction with the ultra-large physical simulation test device 11 for deep engineering disasters, the high-temperature-chemical-multiphase fluid collaborative injection, monitoring and control system 3 comprises a gas injection pressurization and monitoring device and a water injection pressurization and monitoring device which are used for injection and real-time monitoring of liquid phase, gas phase, critical and supercritical gas, a chemical reaction pressurization and monitoring device for realizing injection of acid chemical solution fluid, a constant pressure and constant flow device and a constant temperature and constant pressure device; the robot excavation and monitoring system 4 for a complex engineering structure in a model under deep geological environment is used in conjunction with the ultra-large physical simulation test device 11 for deep engineering disasters, the robot excavation and monitoring system 4 for a complex engineering structure in a model under deep geological environment comprises a three-coordinate feeding system for excavation of primary channels, and a multi-joint peristaltic robot for fine excavation of secondary channels, and fine excavation of tertiary and remote structures, wherein the multi-joint peristaltic robot is provided with a rotary reamer, an auxiliary tooling and a multi-degree-of-freedom flexible manipulator; the intelligent ventilation system 5 for a deep metal mine complex drilling, mining and transferring network is used in conjunction with the ultra-large physical simulation test device 11 for deep engineering disasters, and is used for simulating ventilation engineering activities; the intelligent filling system 6 for a deep metal mine ultra-large stope is used in conjunction with the ultra-large physical simulation test device 11 for deep engineering disasters and is used for simulating filling of the stope; the deep-well enhanced geothermal safe intelligent mining system 7 is used in conjunction with the ultra-large physical simulation test device 11 for deep engineering disasters and is used for simulating drilling of injection wells and production wells; the all-spatial-temporal intelligent high-precision monitoring system 8 for the excavation and fracture process of the large-scale geological model comprises many types of sensors, the sensors are mounted in a pre-embedded manner in a 3D printing process of a physical model sample, and the all-spatial-temporal intelligent high-precision monitoring system 8 for the excavation and fracture process of the large-scale geological model is used for monitoring many types of sensing data; the ultra-large multi-task intelligent collaborative main control and digital twin system 9 for physical simulation tests is located on the ground and adjacent to the ultra-large physical simulation test device 11 for deep engineering disasters, and the multi-task intelligent collaborative main control and digital twin system 9 for physical simulation tests comprises a collaborative main control subsystem for data interconnection, collaborative control and scheduling, as well as data acquisition and display among various systems in the facility, and a big data computing subsystem for batch flow fusion tests used for batch flow fusion processing of a unified computing engine, and a digital twin subsystem for physical simulation tests used for fully transparent interactive display of deep engineering physical simulation tests.

The ultra-large physical simulation test device 11 for deep engineering disasters comprises a horizontal ultra-large reaction frame 17, a vertical ultra-large reaction frame, a first array distributed hydraulic actuator group 18, a second array distributed hydraulic actuator group 19, a third array distributed hydraulic actuator group 20, a fourth array distributed hydraulic actuator group 21, a fifth array distributed hydraulic actuator group 22, a linear distributed hydraulic actuator group 23 and ultra-long stroke lifting and locking hydraulic cylinders 24; the vertical ultra-large reaction frame comprises a reaction top plate 25, support columns 26 and a reaction base 27; the horizontal ultra-large reaction frame 17 adopts a circular structure being circular in an outer part and square in an inner part; the horizontal ultra-large reaction frame 17 is fixedly mounted in the large concrete foundation pit mounting slot 10, and an excavation channel 28 is provided in a side of the horizontal ultra-large reaction frame 17; in the embodiment, a diameter of an outer circle of the horizontal ultra-large reaction frame 17 is 20 m, an inner square side length is 10 m, a vertical height is 5.5 m, and a channel diameter of the excavation channel 28 is 0.5 m; and it should be emphasized that at the present stage, because the horizontal ultra-large reaction frame 17 is limited by many process limit capabilities of casting, heat treatment and processing, such as assembly and transportation, the horizontal ultra-large reaction frame 17 cannot achieve integrated manufacturing at present, and can only adopt splicing. At the same time, due to the problems that a traditional high-strength bolt pre-stressed frame structure has high preload stiffness, large stress concentration, high requirements for the processing accuracy of a composite interface, and the like, the horizontal ultra-large reaction frame 17 is formed by splicing eight segments of arch beams through carbon fiber winding; the vertical ultra-large reaction frame is located inside the horizontal ultra-large reaction frame 17; the reaction base 27 is located directly below the reaction top plate 25, and the reaction base 27 and the reaction top plate 25 are fixedly connected by the four uniformly-distributed support columns 26, and the vertical ultra-large reaction frame forms a double-beam four-column preload frame structure; a drilling channel 29 is formed in the reaction top plate 25; in the embodiment, a space between the reaction base 27 and the reaction top plate 25 is 8.5 m, the number of drilling channels 29 is two, a channel diameter of the drilling channels 29 is 200 mm, the support columns 26 adopt a hollow structure, each support column 26 is internally provided with a pre-stressed pull rod, the reaction top plate 25, the support columns 26 and the reaction base 27 are firmly connected by the pre-stressed pull rods and through preload provided by high-strength nuts, and a guide ring is mounted outside each support column 26, a main body of each guide ring is a copper sleeve friction ring which is used for sliding contact and matching with the horizontal ultra-large reaction frame 17, the reaction base 27 adopts a split casting composite structure, which can bear 300 t of samples and ensure to provide a vertical 15000 t static reaction support. In addition, in order to meet the reliability of the entire vertical ultra-large reaction frame when the actuators are loaded to the limit and the output is 15000 t, reduce impact of tensile deformation of the frame on the test, and improve stability of the whole frame, the pre-stressed pull rods inside the support columns 26 need to be in a tensile stress state, so that the support columns 26 need to always be in a yield stress state; four ultra-long stroke lifting and locking hydraulic cylinders 24 are uniformly arranged between the horizontal ultra-large reaction frame 17 and the reaction top plate 25; a cylinder barrel of each ultra-long stroke lifting and locking hydraulic cylinder 24 is embedded and fixed in the horizontal ultra-large reaction frame 17, and a piston rod of each ultra-long stroke lifting and locking hydraulic cylinder 24 is upwards to be fixedly connected with the reaction top plate 25; the first array distributed hydraulic actuator group 18 is arranged on a lower surface of the reaction top plate 25; the second array distributed hydraulic actuator group 19, the third array distributed hydraulic actuator group 20, the fourth array distributed hydraulic actuator group 21 and the fifth array distributed hydraulic actuator group 22 are respectively arranged on an inner square surface of the horizontal ultra-large reaction frame 17, the second array distributed hydraulic actuator group 19 and the fourth array distributed hydraulic actuator group 21 are distributed in opposite directions, and the third array distributed hydraulic actuator group 20 and the fifth array distributed hydraulic actuator group 22 are distributed in opposite directions; the linear distributed hydraulic actuator group 23 is embedded at a middle of an upper surface of the reaction base 27, and a loading surface of the linear distributed hydraulic actuatorgroup 23 is flush with the upper surface of the reaction base 27; in the embodiment, the first array distributed hydraulic actuator group 18, the second array distributed hydraulic actuator group 19, the third array distributed hydraulic actuator group 20, the fourth array distributed hydraulic actuator group 21 and the fifth array distributed hydraulic actuator group 22 all contain 25 single hydraulic actuators, and the 25 single hydraulic actuators are distributed in a 5*5 array; and the linear distributed hydraulic actuator group 13 contains 5 single hydraulic actuators, and the 5 single hydraulic actuators are distributed in a straight line.

All single hydraulic actuators contained in the linear distributed hydraulic actuator group 23 are dynamic hydraulic actuators, and a maximum disturbance frequency of the dynamic hydraulic actuators is 5 Hz; an external bracket of each dynamic hydraulic actuator comprises four guide rods resisting lateral force; the dynamic hydraulic actuators adopt a double-output rod symmetrical structure, a large-flow integrated valve block is arranged outside a cylinder barrel of each dynamic hydraulic actuator, and each large-flow integrated valve block is provided with double servo valves.

The structures of the single hydraulic actuators contained in the first array distributed hydraulic actuator group 18, the second array distributed hydraulic actuator group 19, the third array distributed hydraulic actuator group 20, the fourth array distributed hydraulic actuator group 21 and the fifth array distributed hydraulic actuator group 22 are the same, a magnetostrictive displacement sensor is arranged between a piston inside a cylinder barrel and a bottom plate of the cylinder barrel of each single hydraulic actuator, a servo valve and an energy accumulator are arranged outside the cylinder barrel of each single hydraulic actuator, and a load sensor is arranged at a piston end of each single hydraulic actuator.

The single hydraulic actuators 31 at centers of the first array distributed hydraulic actuator group 18, the second array distributed hydraulic actuator group 19, the third array distributed hydraulic actuator group 20, the fourth array distributed hydraulic actuator group 21 and the fifth array distributed hydraulic actuator group 22 all adopt through-type hydraulic actuators, and a piston rod of each through-type hydraulic actuator 31 adopts a double-output rod hollow structure. In the embodiment, the number of the through-type hydraulic actuators 31 at a center of the first array distributed hydraulic actuator group 18 is two and a hollow diameter of the piston rod is 300 mm. The number of the through-type hydraulic actuators 31 at a center of the second array distributed hydraulic actuator group 19, at a center of the third array distributed hydraulic actuator group 20, at a center of the fourth array distributed hydraulic actuator group 21 and at a center of the fifth array distributed hydraulic actuator group 22 is one respectively, and a hollow diameter of the piston rod is 500 mm.

A hydraulic oil source system is arranged in the cluster large-flow high-pressure hydraulic pump station 13, adopts a distributed hydraulic station design scheme, and comprises eight hydraulic stations 30 in total; and the first five hydraulic stations are respectively connected with the first array distributed hydraulic actuator group 18, the second array distributed hydraulic actuator group 19, the third array distributed hydraulic actuator group 20, the fourth array distributed hydraulic actuator group 21 and the fifth array distributed hydraulic actuator group 22, the sixth hydraulic station is connected with the linear distributed hydraulic actuator group 23, the seventh hydraulic station is connected with the ultra-long stroke lifting and locking hydraulic cylinders 24, and the eighth hydraulic station serves as a standby hydraulic station. In the embodiment, the maximum flow of the hydraulic station is 4000 L/min, and the rated working pressure of the hydraulic station is 21 MPa.

The long-time large-load loading system for a geological model 1 adopts a distributed network control system with a single actuator controller as a node for redundancy control of the system and hot replacement of the controller; in order to realize the clarity of control logic and the convenience of system maintenance, and more importantly, to ensure smooth implementation of long-term electro-hydraulic servo load holding tests, the distributed network control system comprises three layers of structures, wherein a main controller is in a first layer, loading surface array controllers are in a second layer, and the controller of each independent loading actuator is in a third layer; the main controller is used for human-computer interaction, test management, test mode setting, and local storage and upload of test data; the main controller performs data exchange with the ultra-large multi-task intelligent collaborative main control and digital twin system 9 for physical simulation tests through a Modbus TCP/UDP protocol; the main controller performs data exchange with the loading surface array controller distributed on each loading surface through a network cable according to the Modbus TCP/UDP protocol; and the loading surface array controllers perform data exchange with the controller of each independent loading actuator through a network cable according to the Modbus TCP/UDP protocol.

It needs to be noted that a control channel of the long-time large-load loading system 1 for a geological model in the embodiment comprises 125 static control channels and 5 dynamic control channels, so that the composition of the system is extremely complex. If a traditional centralized control system is adopted, each controller is generally limited by no more than 8 closed-loop control channels. In addition, up to 30 centralized controllers will appear in the controller system for redundant control and protection switching judgement, resulting in a very complex control logic, and a large number of interconnections, and anti-interference ability and reliability are greatly reduced. Once a certain controller fails, there will be 8 actuators out of control at the same time, which will be disastrous for the reliability of the tests. Therefore, when the long-time large-load loading system 1 for a geological model adopts the distributed network control system with the single actuator controller as the node, the control logic is simple and clear, the connection is simple and reliable, and a dual-output displacement sensor and a protection and switching controller as well as a loading surface array controller work together to realize the redundant control of the loading system and the hot replacement of the controller, so that long-time electro-hydraulic servo stable load holding of 5000 hours for the loading control system can be guaranteed.

The simulation of fracture rockbursts is taken as an example, and the test is performed through the ultra-large physical simulation facility for deep engineering disasters, comprising the following steps:

Step I: Preparing the Ultra-Large Physical Model Sample.

The 3D printing system 2 for the deep multiphase multi-component complex geological body model is used to print and make the ultra-large physical model sample on the model sample transferring device 16, wherein the size of the ultra-large physical model sample is 5 m×5 m×5 m, including a structural plane with an inclination of 45 degrees, a length of 3.5 m and a width of 1 m; during the printing process of the ultra-large physical model sample, a stress-strain-vibration-acoustic emission-ultrasonic integrated sensor, a fiber grating high-sensitivity fine temperature-pressure-stress integrated monitoring sensor and an acoustic emission sensor are pre-embedded in the ultra-large physical model sample.

Step II: Transferring the Ultra-Large Physical Model Sample.

After the ultra-large physical model sample is printed and cured, the model sample transferring device 16 is used to transfer the ultra-large physical model sample to the ultra-large physical simulation test device 11 for deep engineering disasters, so that the ultra-large physical model sample is accurately placed on the upper surface of the reaction base 27, and then leads of the stress-strain-vibration-acoustic emission-ultrasonic integrated sensor in the ultra-large physical model sample, the fiber grating high-sensitivity fine temperature-pressure-stress integrated monitoring sensor and the acoustic emission sensor, which are pre-embedded in the ultra-large physical model sample, are electrically connected with the large-scale all-spatial-temporal intelligent high-precision monitoring system 8 for an excavation and fracture process of a geological model, and each sensor is tested before the test to ensure that all sensors can work normally.

Step III: Performing Cooperative Main Control Connection.

All the interfaces of the all-spatial-temporal intelligent high-precision monitoring system 8 for an excavation and fracture process of a large-scale geological model, the long-time large-load loading system 1 for a geological model, and the robot excavation and monitoring system 4 for a complex engineering structure in a model under deep geological environment are electrically connected with the ultra-large multi-task intelligent collaborative main control and digital twin system 9 for physical simulation tests.

Step IV: Mounting the Ultra-Large Physical Model Sample.

The ultra-long stroke lifting and locking hydraulic cylinders 24 are controlled to perform retraction action, so that under the driving of the ultra-long stroke lifting and locking hydraulic cylinders 24, the vertical ultra-large reaction frame moves downward as a whole until the ultra-large physical model sample in the vertical ultra-large reaction frame accurately enters the horizontal ultra-large reaction frame 17.

Step V: Pre-Clamping the Ultra-Large Physical Model Sample.

A displacement control manner is adopted, firstly, the second array distributed hydraulic actuator group 19 and the fourth array distributed hydraulic actuator group 21 pre-clamp the ultra-large physical model sample, and then the third array distributed hydraulic actuator group 20 and the fifth array distributed hydraulic actuator group 22 pre-clamp the ultra-large physical model sample.

Step VI: Performing Pre-Stress Loading.

A load control manner is adopted, firstly, the second array distributed hydraulic actuator group 19 and the fourth array distributed hydraulic actuator group 21 perform pre-stress loading on the ultra-large physical model sample, and the pre-stress is loaded to 0.01 MPa; the third array distributed hydraulic actuator group 20 and the fifth array distributed hydraulic actuator group 22 perform pre-stress loading on the ultra-large physical model sample, and the pre-stress is loaded to 0.01 MPa; then, the displacement control manner is adopted, the first array distributed hydraulic actuator group 19 pre-compresses the ultra-large physical model sample, and then the displacement control manner is changed into the load control manner, the first array distributed hydraulic actuator group 19 performs the pre-stress loading on the ultra-large physical model sample, and the pre-stress is loaded to 0.01 MPa, wherein the load control rate during pre-stress loading is 2 kN/s.

Step VII: Performing Primary Stress Loading.

The load control manner is adopted, firstly, the third array distributed hydraulic actuator group 20 and the fifth array distributed hydraulic actuator group 22 perform primary stress loading on the ultra-large physical model sample, and the primary stress is loaded to 1 MPa; the second array distributed hydraulic actuator group 19 and the fourth array distributed hydraulic actuator group 21 perform primary stress loading on the ultra-large physical model sample, and the primary stress is loaded to 2 MPa; then, the first array distributed hydraulic actuator group 19 performs primary stress loading on the ultra-large physical model sample, and the primary stress is loaded to 5 MPa, wherein, the load control rate during primary stress loading is 2 kN/s; at the same time, in the process of performing primary stress loading, data is monitored synchronously by the magnetostrictive displacement sensor, the load sensor, the stress-strain-vibration-acoustic emission-ultrasonic integrated sensor, the fiber grating high-sensitivity fine temperature-pressure-stress integrated monitoring sensor and the acoustic emission sensor.

Step VIII: Performing Robot Excavation.

The robot excavation and monitoring system 4 for a complex engineering structure in a model under deep geological environment is used to excavate the central hole of the through-type hydraulic actuator at the center of the second array distributed hydraulic actuator group 19, wherein the diameter of the excavation hole is 0.5 m, and the depth of the excavation hole is 4 m; at the same time, the excavation activities are synchronized with the ultra-large multi-task intelligent collaborative main control and digital twin system 9 for physical simulation tests.

Step IX: Performing Stress Maintaining.

After excavation, the ultra-large physical model sample is subjected to stress load holding for 5000 h, and at this stage, the fracture rockbursts with small strength can occur.

Step X: Performing Tectonic Stress Simulation.

When the ultra-large physical model sample completes 5000 h stress load holding, the load control manner is adopted to increase the primary stress loaded by the upper two rows of single actuators of the second array distributed hydraulic actuator group 19 and the fourth array distributed hydraulic actuator group 21, and the loaded primary stress is increased to 4 MPa, which is used to form local high stress at the structural plane of the physical model sample and induce the fracture rockbursts with large strength, at the same time, stress load holding is synchronously rendered and reproduced in the ultra-large multi-task intelligent collaborative main control and digital twin system 9 for physical simulation tests, and the load control rate during stress loading is 2 kN/s; at the same time, in the process of loading, the fracture situation of the excavation hole is observed, data is monitored synchronously by the magnetostrictive displacement sensor, the load sensor, the stress-strain-vibration-acoustic emission-ultrasonic integrated sensor, the fiber grating high-sensitivity fine temperature-pressure-stress integrated monitoring sensor and the acoustic emission sensor.

Step XI: Performing Dynamic Disturbance Stress Loading.

The linear distributed hydraulic actuator group 23 is used to perform local dynamic disturbance on the ultra-large physical model sample on the basis of static stress, the application frequency is 5 Hz, the amplitude is 1 MPa, the disturbance load time is 30 minutes, the fracture rockbursts with large strength are induced, and at the same time, the rockbursts are synchronously rendered and reproduced in the ultra-large multi-task intelligent collaborative main control and digital twin system 9 for physical simulation tests; at the same time, in the process of local dynamic disturbance, the fracture situation of the excavation hole is observed, data is monitored synchronously by the magnetostrictive displacement sensor, the load sensor, the stress-strain-vibration-acoustic emission-ultrasonic integrated sensor, the fiber grating high-sensitivity fine temperature-pressure-stress integrated monitoring sensor and the acoustic emission sensor.

Step XII: Performing Unloading.

The displacement control manner is adopted, firstly, the linear distributed hydraulic actuator group 23 is unloaded to 0 MPa, then the first array distributed hydraulic actuator group 18 is unloaded to 4 MPa, then the first array distributed hydraulic actuator group 18 and the second array distributed hydraulic actuator group 19 as well as the upper two rows of the single actuators of the fourth array distributed hydraulic actuator group 21 are simultaneously unloaded to 2 MPa, then the first array distributed hydraulic actuator group 18, the second array distributed hydraulic actuator group 19 and the fourth array distributed hydraulic actuator group 21 are simultaneously unloaded to 1 MPa, and finally, the first array distributed hydraulic actuator group 18, the second array distributed hydraulic actuator group 19, the third array distributed hydraulic actuator group 20, the fourth array distributed hydraulic actuator group 21 and the fifth array distributed hydraulic actuator group 22 are synchronously unloaded to 0 MPa, wherein the displacement control rate is 10 mm/min.

Step XIII: Performing Sample Disassembly.

The leads of the stress-strain-vibration-acoustic emission-ultrasonic integrated sensor, the fiber grating high-sensitivity fine temperature-pressure-stress integrated monitoring sensor and the acoustic emission sensor are disconnected with the all-spatial-temporal intelligent high-precision monitoring system 8 for the excavation and fracture process of the large-scale geological model, and then the ultra-long stroke lifting and locking hydraulic cylinders 24 are controlled to perform extension action, so that under the driving of the ultra-long stroke lifting and locking hydraulic cylinders 24, the vertical ultra-large reaction frame moves upwards as a whole until the ultra-large physical model sample in the vertical ultra-large reaction frame is completely removed from the horizontal ultra-large reaction frame 17; and finally, the model sample transferring device 16 is used to remove the ultra-large physical model sample from the ultra-large physical simulation test device 11 for deep engineering disasters, so that the sample disassembly is completed.

The scheme in the embodiments is not intended to limit the scope of patent protection of the invention. Any equivalent implementation or change that does not deviate from the invention is included in the scope of the patent of the case.

What is claimed is:

1. An ultra-large physical simulation facility for deep engineering disasters, comprising: a long-time large-load loading system for a geological model, a 3D printing system of a deep oil, gas and water multiphase multi-component complex geological body model, a high-temperature-chemical-multiphase fluid collaborative injection, monitoring and control system, a robot excavation and monitoring system for a complex engineering structure in a model under deep geological environment, an intelligent ventilation system for a deep metal mine complex drilling, mining and transferring network, an intelligent filling system for a deep metal mine ultra-large stope, a deep-well enhanced geothermal safe intelligent mining system, an all-spatial-temporal intelligent high-precision monitoring system for an excavation and fracture process of a large-scale geological model, and an ultra-large multi-task intelligent collaborative main control and digital twin system for physical simulation tests, wherein the long-time large-load loading system for the geological model comprises a large concrete foundation pit mounting slot, an ultra-large physical simulation test device for deep engineering disasters, a distributed main control center, a cluster large-flow high-pressure hydraulic pump station, a circulating cooling water cooling tower and an electric control cabinet; the ultra-large physical simulation test device for deep engineering disasters is arranged in the large concrete foundation pit mounting slot; the distributed main control center, the circulating cooling water cooling tower and the electric control cabinet are located on a ground and adjacent to the large concrete foundation pit mounting slot; the cluster large-flow high-pressure hydraulic pump station is located under the ground, and is adjacent to the large concrete foundation pit mounting slot; the 3D printing system of the deep oil, gas and water multiphase multi-component complex geological body model is located on the ground and adjacent to the ultra-large physical simulation test device for deep engineering disasters, and a model sample transferring device is configured between the 3D printing system of the deep oil, gas and water multiphase multi-component complex geological body model and the ultra-large physical simulation test device for deep engineering disasters; the high-temperature-chemical-multiphase fluid collaborative injection, monitoring and control system is used in conjunction with the ultra-large physical simulation test device for deep engineering disasters, and comprises a gas injection pressurization and monitoring device and a water injection pressurization and monitoring device which are used for injection and real-time monitoring of liquid phase, gas phase, critical and supercritical gas, a chemical reaction pressurization and monitoring device for realizing injection of acid chemical solution fluid, a constant pressure and constant flow device and a constant temperature and constant pressure device; the robot excavation and monitoring system for the complex engineering structure in a model under deep geological environment is used in conjunction with the ultra-large physical simulation test device for deep engineering disasters, and comprises a three-coordinate feeding system for excavation of primary channels, and a multi-joint peristaltic robot for fine excavation of secondary channels and fine excavation of tertiary and remote structures, wherein the multi-joint peristaltic robot is provided with a rotary reamer, an auxiliary tooling and a multi-degree-of-freedom flexible manipulator; the intelligent ventilation system for the deep metal mine complex drilling, mining and transferring network is used in conjunction with the ultra-large physical simulation test device for deep engineering disasters, and is used for simulating ventilation engineering activities; the intelligent filling system for the deep metal mine ultra-large stope is used in conjunction with the ultra-large physical simulation test device for deep engineering disasters and is used for simulating filling of the stope; the deep-well enhanced geothermal safe intelligent mining system is used in conjunction with the ultra-large physical simulation test device for deep engineering disasters and is used for simulating drilling of injection wells and production wells; the all-spatial-temporal intelligent high-precision monitoring system for the excavation and fracture process of the large-scale geological model comprises many types of sensors, the sensors are mounted in a pre-embedded manner in a 3D printing process of a physical model sample, and the all-spatial-temporal intelligent high-precision monitoring system for the excavation and fracture process of the large-scale geological model is used for monitoring many types of sensing data; and the ultra-large multi-task intelligent collaborative main control and digital twin system for the physical simulation tests is located on the ground and adjacent to the ultra-large physical simulation test device for deep engineering disasters, and comprises a collaborative main control subsystem for data interconnection, collaborative control and scheduling, as well as data acquisition and display among various systems in the facility, and a big data computing subsystem for batch flow fusion tests used for batch flow fusion processing of a unified computing engine, and a digital twin subsystem for physical simulation tests used for fully transparent interactive display of deep engineering physical simulation tests.

2. The ultra-large physical simulation facility according to claim 1, wherein the ultra-large physical simulation test device for deep engineering disasters comprises a horizontal ultra-large reaction frame, a vertical ultra-large reaction frame, a first array distributed hydraulic actuatorgroup, a second array distributed hydraulic actuator group, a third array distributed hydraulic actuator group, a fourth array distributed hydraulic actuator group, a fifth array distributed hydraulic actuator group, a linear distributed hydraulic actuator group and ultra-long stroke lifting and locking hydraulic cylinders, wherein the vertical ultra-large reaction frame comprises a reaction top plate, support columns and a reaction base; the horizontal ultra-large reaction frame adopts a circular structure being circular in an outer part and square in an inner part; the horizontal ultra-large reaction frame is fixedly mounted in the large concrete foundation pit mounting slot, and an excavation channel is provided in a side of the horizontal ultra-large reaction frame; the horizontal ultra-large reaction frame is formed by splicing eight segments of arch beams through carbon fiber winding; the vertical ultra-large reaction frame is located inside the horizontal ultra-large reaction frame; the reaction base is located directly below the reaction top plate, the reaction base and the reaction top plate are fixedly connected by the four uniformly-distributed support columns, and the vertical ultra-large reaction frame forms a double-beam four-column preload frame structure; a drilling channel is formed in the reaction top plate; the four ultra-long stroke lifting and locking hydraulic cylinders are uniformly arranged between the horizontal ultra-large reaction frame and the reaction top plate; a cylinder barrel of each ultra-long stroke lifting and locking hydraulic cylinder is embedded and fixed in the horizontal ultra-large reaction frame, and a piston rod of each ultra-long stroke lifting and locking hydraulic cylinder is upwards to be fixedly connected with the reaction top plate; the first array distributed hydraulic actuator group is arranged on a lower surface of the reaction top plate; the second array distributed hydraulic actuator group, the third array distributed hydraulic actuator group, the fourth array distributed hydraulic actuator group and the fifth array distributed hydraulic actuator group are respectively arranged on an inner square surface of the horizontal ultra-large reaction frame, the second array distributed hydraulic actuator group and the fourth array distributed hydraulic actuator group are distributed in opposite directions, and the third array distributed hydraulic actuator group and the fifth array distributed hydraulic actuator group are distributed in opposite directions; and the linear distributed hydraulic actuator group is embedded at a middle of an upper surface of the reaction base, and a loading surface of the linear distributed hydraulic actuator group is flush with the upper surface of the reaction base.

3. The ultra-large physical simulation facility according to claim 2, wherein all single hydraulic actuators contained in the linear distributed hydraulic actuator group are dynamic hydraulic actuators, and a maximum disturbance frequency of the dynamic hydraulic actuators is 5 Hz; an external bracket of each dynamic hydraulic actuator comprises four guide rods resisting lateral force; and each dynamic hydraulic actuator adopts a double-output rod symmetrical structure, a large-flow integrated valve block is arranged outside a cylinder barrel of each dynamic hydraulic actuator, and each large-flow integrated valve block is provided with double servo valves.

4. The ultra-large physical simulation facility according to claim 3, wherein the structures of single hydraulic actuators contained in the first array distributed hydraulic actuator group, the second array distributed hydraulic actuator group, the third array distributed hydraulic actuator group, the fourth array distributed hydraulic actuator group and the fifth array distributed hydraulic actuator group are the same, a magnetostrictive displacement sensor is arranged between a piston inside a cylinder barrel and a bottom plate of the cylinder barrel of each single hydraulic actuator, a servo valve and an energy accumulator are arranged outside the cylinder barrel of each single hydraulic actuator, and a load sensor is arranged at a piston end of each single hydraulic actuator.

5. The ultra-large physical simulation facility according to claim 4, wherein the single hydraulic actuators at centers of the first array distributed hydraulic actuator group, the second array distributed hydraulic actuator group, the third array distributed hydraulic actuator group, the fourth array distributed hydraulic actuator group and the fifth array distributed hydraulic actuator group all adopt through-type hydraulic actuators, and a piston rod of each through-type hydraulic actuator adopts a double-output rod hollow structure.

6. The ultra-large physical simulation facility according to claim 5, wherein a hydraulic oil source system is arranged in the cluster large-flow high-pressure hydraulic pump station, adopts a distributed hydraulic station design scheme, and comprises eight hydraulic stations in total; and the first five hydraulic stations are respectively connected with the first array distributed hydraulic actuator group, the second array distributed hydraulic actuator group, the third array distributed hydraulic actuator group, the fourth array distributed hydraulic actuator group and the fifth array distributed hydraulic actuator group, the sixth hydraulic station is connected with the linear distributed hydraulic actuator group, the seventh hydraulic station is connected with the ultra-long stroke lifting and locking hydraulic cylinders, and the eighth hydraulic station serves as a standby hydraulic station.

7. The ultra-large physical simulation facility according to claim 6, wherein the long-time large-load loading system for the geological model adopts a distributed network control system with a single actuator controller as a node for redundancy control of the system and hot replacement of the controller; the distributed network control system comprises three layers of structures, wherein a main controller is in a first layer, loading surface array controllers are in a second layer, and a controller of each independent loading actuator is in a third layer; the main controller is used for human-computer interaction, test management, test mode setting, and local storage and upload of test data; the main controller performs data exchange with the ultra-large multi-task intelligent collaborative main control and digital twin system for the physical simulation tests through a Modbus TCP/UDP protocol; the main controller performs data exchange with the loading surface array controller distributed on each loading surface through a network cable according to the Modbus TCP/UDP protocol; and the loading surface array controllers perform data exchange with the controller of each independent loading actuator through a network cable according to the Modbus TCP/UDP protocol.

* * * * *